Figure 1:
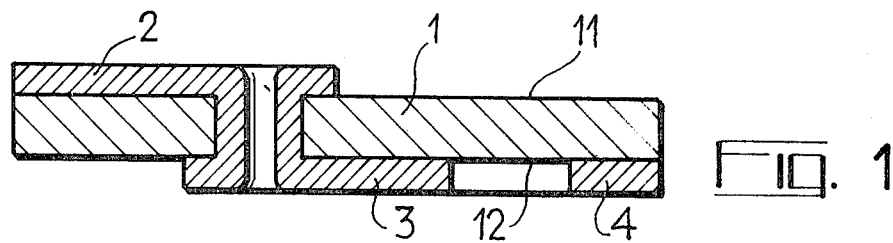

United States Patent [19]
Bonnel

[11] 3,945,113
[45] Mar. 23, 1976

[54] METHOD FOR MANUFACTURING A CONNECTING CIRCUIT FOR AN INTEGRATED MINIATURISED WIRING SYSTEM

[75] Inventor: Michele Bonnel, Paris, France

[73] Assignee: Thomson-CSF, Paris, France

[22] Filed: Feb. 26, 1974

[21] Appl. No.: 445,855

[30] Foreign Application Priority Data
Mar. 2, 1973 France .................. 73.07541

[52] U.S. Cl. .............. 29/625; 96/36.2; 156/3; 156/8; 156/11; 204/15; 204/32 R; 204/38 B; 204/38 S; 204/38 E
[51] Int. Cl.² .................... H05K 3/00
[58] Field of Search ........ 29/624, 625; 174/68.5; 204/15, 20, 29, 30, 32 R, 32 S, 38 B, 38 S, 38 E, 46; 117/212, 213; 96/36.2, 38, 38.4; 156/3, 6, 8, 11

[56] References Cited
UNITED STATES PATENTS

| | | | |
|---|---|---|---|
| 3,206,342 | 9/1965 | Briggs | 117/212 X |
| 3,483,615 | 12/1969 | Gottfried | 29/625 |
| 3,566,461 | 3/1971 | Carbonel | 204/15 X |
| 3,583,066 | 6/1971 | Carbonel | 29/625 X |
| 3,606,677 | 9/1971 | Ryan | 29/625 |
| 3,611,558 | 10/1971 | Carbonel | 29/625 X |

Primary Examiner—C. W. Lanham
Assistant Examiner—Joseph A. Walkowski
Attorney, Agent, or Firm—Cushman, Darby & Cushman

[57] ABSTRACT

A method for manufacturing a connecting circuit comprises essentially the stages of deposition of conductors upon a first metal which is etchable by chemical agent and, said semiconductors resisting said agent and the replacing of said first metal which have been removed by an insulating material in which said conductors are embedded, and hollowing out said material to form a cavity and to open into said cavity one of the ends of said conductors.

2 Claims, 8 Drawing Figures

METHOD FOR MANUFACTURING A CONNECTING CIRCUIT FOR AN INTEGRATED MINIATURISED WIRING SYSTEM

The present invention relates to a multilayer connecting circuit for integrated miniaturised wiring systems. It relates likewise to a method for manufacturing such circuits, in which cavities expose the conductor extremities in the encapsulation. This method has a certain number of stages which are involved in the manufacture of the miniaturised wiring system circuits properly so called, this making use only of the technique employed for said manufacturing operation.

These cavities make it possible, amongst other things, to directly solder the conductors of the miniature wiring system, without the need for any intermediate element, said conductors terminating at the printed circuit board, to the output electrodes of the integrated circuits.

At the present time, the only known method is to connect the terminals of the integrated circuit to those of the housing, and then to connect the output connections of the housing to the printed circuit board. This means two soldering operations per output and requires the use of quite bulky housings in relation to the side of the integrated circuit itself.

The object of the present invention is to overcome these drawbacks and the invention relates to a method for manufacturing an integrated miniaturised wiring system circuit of the kind comprising one or more layers of conductors encapsulated in an insulator and forming a compact block, in that one or more cavities having a surface slightly higher than the surface of the device it is desired to incorporate into the assembly, are formed inside the said compact block during its manufacture, so that the ends of the conductors open into said cavities and can readily be soldered to the appropriate outputs of the device which may, for example, be an integrated circuit.

According to the present invention, there is provided a method for manufacturing a multilayer connecting circuit for an integrated miniaturised wiring system of the kind comprising the deposition of conductors upon a first metal which is etchable by certain chemical agents, said conductors resisting said etching action, and the replacing of said first metal which has been removed, by an insulating material, comprising the following stages:

a. first etching of a part of said first metal, down to a predetermined thickness;
b. replacement of said first etched metal by an insulating layer;
c. first covering of the whole external surface of the device with a thin layer of said first metal;
d. localising and deposition on said thin layer of a photosensitive resin mask;
e. second covering of the whole of the device with the exception of the zone protected by the mask, with a thick layer of said first metal;
f. removal of said mask and laying bare of said thin layer at its location;
g. rapid etching by said chemical agent, of said thin layer and exposing of said insulator at this location;
h. hollowing out of the insulator thus bared, forming a cavity in which there terminates at least one end of said conductors;
i. chemical etching by means of said chemical agent, of the whole of said thick layer and of said first metal.

The invention will be better understood from a consideration of the following explanations and the eight attached figures, each of which illustrates a stage in the manufacture of a device in accordance with the invention.

FIG. 1 illustrates a two-layer connecting circuit manufactured by a known method, as it appears at the manufacturing stage from which the following manufacturing stages are involved in accordance with the invention.

Figure 2:
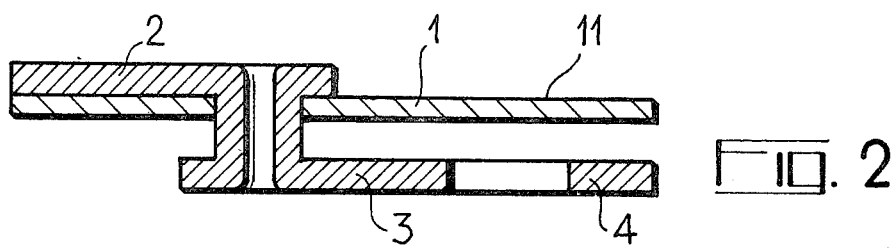
Figure 3:
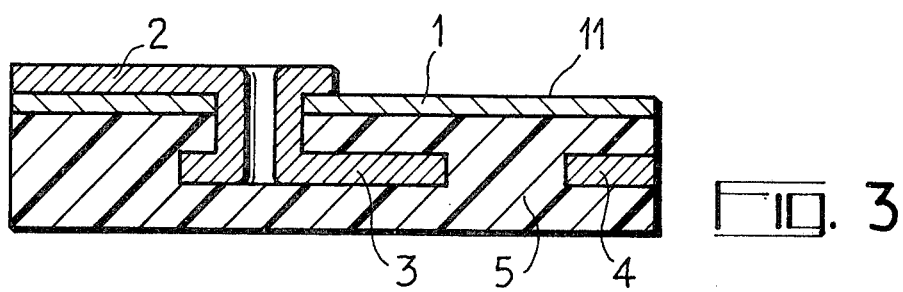
Figure 4:
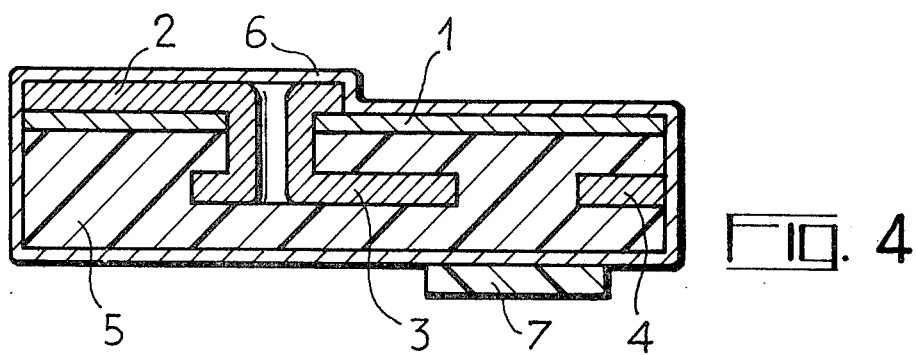
Figure 5:
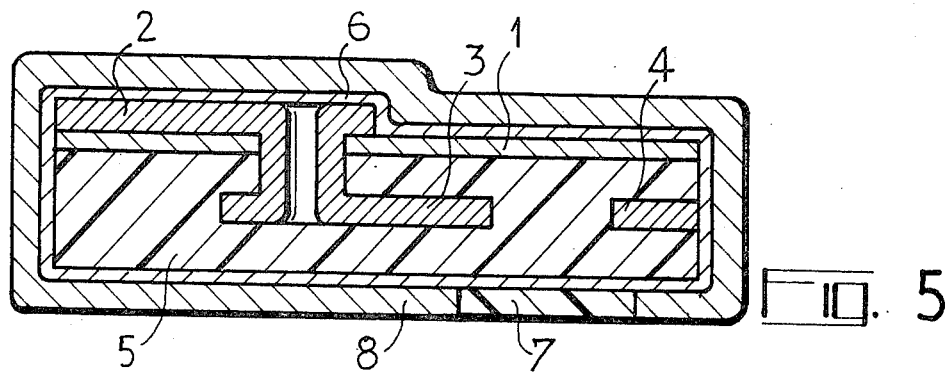
Figure 6:
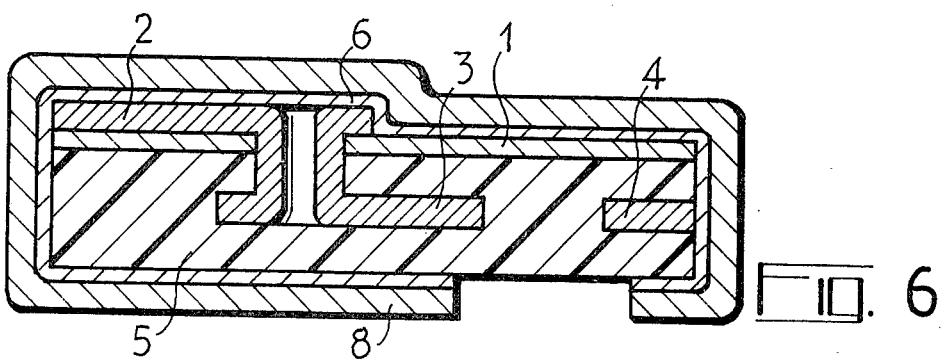
Figure 7:
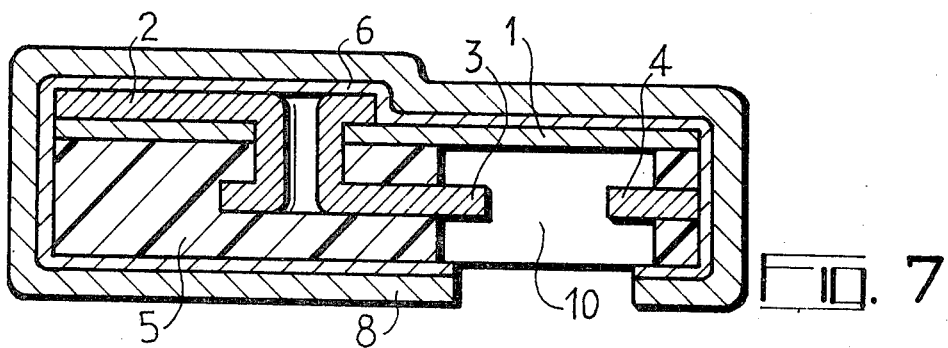
Figure 8:
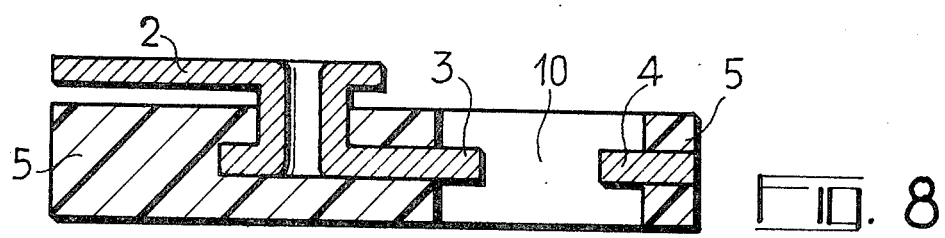

FIG. 2 shows a partially etched layer.
FIG. 3 shows the circuit with an encapsulating resin layer.
FIG. 4 shows the connecting circuit.
FIG. 5 shows a thickened layer.
FIG. 6 shows the circuit with the thin layer dissolved.
FIG. 7 shows the assembly after etching of the insulator.
FIG. 8 shows the completed circuit with conductors.

The circuit shown in FIG. 1 comprises:

A layer 1 having two faces 11 and 12, of a material readily attacked by a chemical agent, e.g. a material such as copper; a connector 2 deposited upon the first face 11 and connectors 3 and 4 deposited upon the second face 12, of said layer 1, in a given profile and made of a material which is resistant to said chemical agent, of material such as gold for example.

FIG. 2 shows the layer 1 which is partially etched, from the face 12, by the reactive agent, down to a predetermined thickness which is as small as possible but nevertheless compatible with forward manipulation of the device during the ensuing operations.

FIG. 3 shows the device encapsulated in a resin layer 5 which, amongst other things, fills out the gaps left by the removal of the copper leaving the face 11 still exposed. This resin layer is an insulator in which the connections located at the face 12 are embedded. It is in this insulator where, in accordance with the invention, the cavities are formed into which the integrated circuits are inserted.

The whole external surface of the device is subsequently completely covered with a thin layer 6 of the same material as the layer 1, upon which there is locally deposited a resin mask 7 whose function will be explained hereinafter.

FIG. 4 illustrates the connecting circuit at the end of this stage. The dimensions of the mask 7 and its locations are determined by the dimensions of the cavity which is to be produced and the positioning of the latter in the resin, 5, at the level of the conductors 3 and 4, for example. The application of said thin layer of copper 6 and of the resin mask 7, makes exclusive use of known techniques such as the so-called "electroless" methods in the case of the copper 6, and photo etching in the case of the mask 7.

FIG. 5 shows the layer 6 which is thickened by, for example, the electrolytic deposition of a thick film 8 of copper which covers the thin film 6 overall except where the mask protects it.

FIG. 6 illustrates the next stage during that the mask 7 having previously been dissolved, short-term chemical etching is carried out to eliminate the thin layer of copper 6 at the location exposed by the departure of the mask 7. The duration of the chemical etching operation is such that the thin layer 6 is dissolved whereas the thick layer remains virtually untouched as FIG. 6 shows.

FIG. 7 illustrates the assembly when it has been subjected to the ensuing manufacturing stage, during which etching of the insulator 5 has been carried out from the zones bared by the localised removal of the thin layer 6 using a reactive agent which etches neither copper nor gold. The result is the hollowing out of the insulator and the formation in the insulator 5 of a cavity 10 into which the ends of the conductors 3 and 4 are opened.

FIG. 8 illustrates the final step of manufacture of the circuit in accordance with the invention. During said step the whole of the remaining copper is removed by means of a fresh chemical etching operation of sufficient length. The circuit then takes the form shown in FIG. 8, completed with its network of conductors 2, 3 and 4 embedded in the insulating resin 5 except for the cavity 10 which is ready to take the integrated circuit (not shown in the figure), for connection to the conductors 3 and 4.

The invention described relates to a two-layer circuit comprising two levels of conductors, however, it goes without saying that using the same techniques and by repeating the process described in accordance with the invention, several times, it is possible to manufacture multilayer circuits equipped with cavities formed inside the insulator encapsulating the conductors.

I claim:

1. A method for manufacturing a connecting circuit for an integrated miniaturised wiring system said circuit including conductors having one of their ends opened into a cavity in which said system is to incorporated, said method comprising depositing said conductors upon a first metal which is etchable by certain chemical agents, said conductors resisting said agents the etching of a part of said first metal and the replacing of said first metal which has been removed, by an insulating material in which said ends of said conductors are embedded said method further comprising the following stages:
    a. first covering of the whole external surface of the device thus obtained with a thin layer of said first metal;
    b. localising and depositing on said thin layer of a photosensitive resin mask, determined by the dimension of said cavity;
    c. second covering of the whole of the device with the exception of the zone protected by said mask, with a thick layer of said first metal;
    d. removal of said mask laying bare of said thin layer;
    e. rapid etching by said chemical agents, of said thin layer and baring said insulating material at this location;
    f. hollowing out of said insulating material thus bared, forming
    said cavity in which at least one end of said conductors is opened into;
    g. chemical etching by means of one of said chemical agents of the whole of said thick layer and of said first metal.

2. A method as claimed in claim 1, wherein said first metal is copper and the material constituting the conductors, gold.

* * * * *